United States Patent [19]
Ohnishi et al.

[11] Patent Number: 5,806,159
[45] Date of Patent: Sep. 15, 1998

[54] PIEZOELECTRIC CERAMIC TRANSFORMER

[75] Inventors: Osamu Ohnishi; Takeshi Inoue, both of Tokyo, Japan

[73] Assignee: NEC Corporation, Tokyo, Japan

[21] Appl. No.: 665,913

[22] Filed: Jun. 19, 1996

Related U.S. Application Data

[62] Division of Ser. No. 348,925, Nov. 25, 1994, Pat. No. 5,576,590.

[30] Foreign Application Priority Data

| Jul. 26, 1994 | [JP] | Japan | .................................. 6-174415 |
| Jul. 26, 1994 | [JP] | Japan | .................................. 6-174416 |
| Jul. 26, 1994 | [JP] | Japan | .................................. 6-174417 |

[51] Int. Cl.$^6$ .................................................. H04R 17/00
[52] U.S. Cl. .......................................................... 29/25.35
[58] Field of Search ........................... 29/25.35; 264/435, 264/436; 310/359

[56] References Cited

U.S. PATENT DOCUMENTS

| 3,562,792 | 2/1971 | Berlincourt et al. . |
| 3,945,099 | 3/1976 | Kansy ..................................... 29/25.35 |
| 4,464,639 | 8/1984 | Staples .................................... 29/2.35 |
| 4,564,782 | 1/1986 | Ogawa . |
| 5,118,982 | 6/1992 | Ohnishi et al. . |
| 5,365,141 | 11/1994 | Kawai et al. . |
| 5,402,031 | 3/1995 | Tagami et al. . |
| 5,424,602 | 6/1995 | Sato et al. . |
| 5,440,195 | 8/1995 | Ohnishi et al. . |
| 5,463,266 | 10/1995 | Fukuoka et al. . |

FOREIGN PATENT DOCUMENTS

| 0605900A1 | 7/1994 | European Pat. Off. . |
| 0079778 | 5/1983 | Japan . |

OTHER PUBLICATIONS

"Piezoelectric Transformers", *Electronics Letters*, Mar. 31, 1988, vol. 24, No. 7, pp. 444–445.

"Ceramic Transformers and Filters", *Proc. Electronic, Comp. Sym.*, 1956, pp. 205–211.

"Multilayered Piezoelectric Transformer", *Ferroelectrics*, 1985, vol. 63, pp. 299–308.

*Primary Examiner*—Carl E. Hall
*Assistant Examiner*—Christopher Goins
*Attorney, Agent, or Firm*—Sughrue, Mion, Zinn, Macpeak & Seas, PLLC

[57] ABSTRACT

One driver having external electrodes arranged over both surfaces of a piezoelectric ceramic plate polarized in the direction of its thickness, and one generator having two mutually opposed interdigital electrodes on one or both surfaces of a piezoelectric ceramic plate and alternately polarized in the direction of its length between the electrode fingers of the interdigital electrodes are formed combined in alignment in the direction of the length of the piezoelectric ceramic plate. Alternatively, the driver and generator may be formed in alignment in the direction of the width of piezoelectric ceramic plate. By applying a low voltage to this piezoelectric ceramic transformer from the driver at a resonance frequency of a longitudinal vibration of second order mode of the piezoelectric ceramic plate, a high voltage can be picked up from the generator. Here, through connection of the input terminals and output terminals at the nodes of vibration, failure due to vibration of lead wires can be prevented, thereby obtaining a compact and slim transformer element that provides high reliability. A plurality of drivers and generators may also be employed, and in addition, an interdigital electrode may be used in the driver as well as in the generator.

4 Claims, 5 Drawing Sheets

PIEZOELECTRIC CERAMIC TRANSFORMER

This is a divisional of application Ser. No. 08/348,925 filed Nov. 25, 1994 U.S. Pat. No. 5,576,590.

BACKGROUND OF THE INVENTION

1. Field of the Invention

The present invention relates to a piezoelectric ceramic transformer used in various types of power circuits for generating high voltage, and particularly to a highly reliable piezoelectric ceramic transformer which is thin and compact, and which also generates high voltage.

2. Description of the Related Art

In recent years, wound-type electromagnetic transformers have been used for generating high voltage in internal power circuits of devices such as television deflecting devices or charging devices of copiers which require for high voltage. Such electromagnetic transformers take the form of a conductor wound onto a core of magnetic substance. Because a large number of turns of the conductor are required to realize a high transformation ratio, electromagnetic transformers that are compact and slim in shape are extremely difficult to produce.

To remedy this problem, piezoelectric transformers utilizing the piezoelectric effect have been provided. FIG. 1 shows the construction of a Rosen-type piezoelectric transformer, a representative example of a piezoelectric transformer of the prior art. For producing high voltage, the portion indicated 41 in this piezoelectric ceramic transformer is its low-impedance driver provided with electrodes 43, 44 on its upper and lower surfaces, this portion being polarized in the direction of the thickness of a piezoelectric plate as shown by the arrow 49 in the figure. The portion indicated 42 in the figure is a high-impedance generator provided with electrode 45 at its end, the generator 42 being polarized along the length of the piezoelectric plate as shown by the arrow 50 in the figure. This piezoelectric transformer operates as follows: When voltage is impressed to drive electrodes 43, 44 from external terminals 46, 47, an electric field increases in the direction of polarization, and a longitudinal vibration in the longitudinal direction is excited by the piezoelectric effect displaced in a direction perpendicular to polarization (hereinafter abbreviated "piezoelectric transverse effect 31 mode"), whereby the entire transformer vibrates. Moreover, in generator 42, due to the piezoelectric effect generating a potential difference in the polarization direction (hereinafter abbreviated "piezoelectric longitudinal effect 33 mode") which is caused by a mechanical stain occurring in the polarization direction, a voltage is produced which has the same frequency as the input voltage from output electrode 45 to external terminal 48. At this time, if the drive frequency is made equal to the resonance frequency of the piezoelectric transformer, an extremely high output voltage can be obtained. Furthermore, for inputting high voltage and outputting low voltage, the high-impedance section 42 of longitudinal effect can obviously be made the input side and the low-impedance section 41 of transverse effect be made the output side.

This piezoelectric transformer is used in a resonant state, and compared with ordinary electromagnetic transformers, has numerous advantages including: 1) a compact and slim shape can be achieved because a wound-type construction is not required and energy density is high; 2) non-combustibility is possible; and 3) there is no electromagnetic induction noise. Nevertheless, in this Rosen-type piezoelectric transformer of the prior art, the electrode of the generator portion is located at the end of the transformer, i.e., at the loop of vibration, and external electric terminal of lead wire must also be led out from this portion. In such a case, because the mass of the terminal of the lead wire as well as connection component such as solder lies at the loop of vibration, there is an increase in mechanical loss and hunting of frequency characteristics during resonance. Increase in mechanical loss causes a drop in efficiency, while hunting in frequency characteristic causes instability in circuit operation, both problems posing serious obstacles to putting such a transformer into practical use.

In addition, in contrast with a piezoelectric element used for signal processing such as in filters, a piezoelectric transformer must operate at relatively high power and is caused to vibrate at large amplitudes approaching the capacity limits of piezoelectric materials. In such a piezoelectric transformer, the location of the connection components at the loop of vibration means that the connection components receive the brunt of large vibrations, with the result that, despite the use of connection methods such as soldering or bonding, the reliability of the connection components is severely compromised in terms of life expectancy.

There is the further disadvantage that, although a relatively high output voltage can be obtained when the load resistance value is significantly greater than the piezoelectric transformer impedance, when the load resistance value is not so large, a particularly high output voltage cannot be obtained.

Furthermore, as is clear from FIG. 1, there is the problem that this Rosen-type piezoelectric transformer is of three-terminal construction and electrical insulation between the input and output cannot be achieved.

SUMMARY OF THE INVENTION

The object of the present invention is to provide a piezoelectric ceramic transformer that solves the above-described problems, that has the characteristics of high voltage, high power, and high reliability, and which furthermore is slim and compact.

To achieve this object, the first invention of the piezoelectric ceramic transformer comprises a piezoelectric ceramic plate which is a piezoelectric vibration material in the form of a rectangular plate comprising at least one driver and at least one generator, each of the drivers and generators being arranged in a line in arbitrary order along the longitudinal direction; input terminals for applying a common voltage to each driver; and output terminals for picking up a common voltage from each generator; each driver having a pair of opposing external electrodes, one on each side of the piezoelectric ceramic plate in the direction of thickness, the piezoelectric ceramic plate of the driver being polarized in the direction of thickness, each generator having an interdigital electrode assembly provided on at least one surface of the piezoelectric ceramic plate in the direction of thickness; one part of the interdigital electrode assembly being made up of a plurality of electrode fingers spaced at intervals and parallel to the direction of width of the piezoelectric ceramic plate, and a connecting electrode linking these electrode fingers; this part and another part of similar construction being arranged such that electrode fingers of both parts alternately project so as to oppose each other across the width of the piezoelectric ceramic plate; and moreover, the piezoelectric ceramic plate of the generator being polarized in alternating longitudinal directions between each adjacent pair of electrode fingers; the input terminals being connected to the pair of external electrodes of each driver and the output terminals being connected to the interdigital electrode assembly of each generator, all input and output terminals being connected at points that are nodes of vibration when the piezoelectric ceramic plate is driven at longitudinal vibration resonance frequency of the piezoelectric ceramic plate.

The second invention of the piezoelectric ceramic transformer comprises a piezoelectric ceramic plate which is a piezoelectric vibration material in the form of a rectangular plate, in the direction of width of which are arranged one driver and one generator; input terminals for applying a voltage to the driver; and output terminals for picking up voltage from the generator; the driver having a pair of opposing external electrodes, one on each side of the piezoelectric ceramic plate in the direction of thickness, and the piezoelectric ceramic plate of the driver being polarized in the direction of thickness, the generator having an interdigital electrode assembly provided on at least one surface of the piezoelectric ceramic plate in the direction of thickness; one part of the interdigital electrode assembly being made up of a plurality of electrode fingers spaced at intervals and parallel to the direction of width of the piezoelectric ceramic plate, and a connecting electrode linking these electrode fingers; this part and another part of similar construction being arranged such that electrode fingers of both parts alternately project so as to oppose each other across the width of the piezoelectric ceramic plate; and moreover, the piezoelectric ceramic plate of the generator being polarized in alternating longitudinal directions between each adjacent pair of electrode fingers; the input terminals and the output terminals being connected to the external electrode pair and the interdigital electrode assembly, respectively, at the center of the driver and generator, respectively, in the direction of length of the piezoelectric ceramic plate.

The third invention of the piezoelectric ceramic transformer comprises a piezoelectric ceramic plate which is a piezoelectric vibration material in the form of a rectangular plate comprising at least one driver and at least one generator, each of the drivers and generators being arranged in a line in arbitrary order along the longitudinal direction; input terminals for applying a common voltage to each driver; and output terminals for picking up a common voltage from each generator; each of the drivers and the generators having an interdigital electrode assembly provided on at least one surface of the piezoelectric ceramic plate; one part of each interdigital electrode assembly being made up of a plurality of electrode fingers spaced at intervals and parallel to the direction of width of the piezoelectric ceramic plate, and a connecting electrode linking these electrode fingers; this part and another part of similar construction being arranged such that electrode fingers of both parts alternately project so as to oppose each other across the width of the piezoelectric ceramic plate; and moreover, the piezoelectric ceramic plate of each of the drivers and the generators being polarized in alternating longitudinal directions between each adjacent pair of electrode fingers; the input terminals and the output terminals being connected to the corresponding interdigital electrode assembly at the center of each of the drivers and the generators, respectively, in the direction of length of the piezoelectric ceramic plate.

The fourth invention of the piezoelectric ceramic transformer comprises a piezoelectric ceramic plate which is a piezoelectric vibration material in the form of a rectangular plate, in the direction of length of which are arranged one driver and one generator; input terminals for applying a voltage to the driver; and output terminals for picking up voltage from the generator; the driver having an interdigital electrode assembly provided on one surface of the piezoelectric ceramic plate; one part of the interdigital electrode assembly being made up of a plurality of electrode fingers spaced at intervals and parallel to the direction of width of the piezoelectric ceramic plate and a connecting electrode linking these electrode fingers; this part and another part of similar construction being arranged such that electrode fingers of both parts alternately project so as to oppose each other across the width of the piezoelectric ceramic plate; and moreover, the piezoelectric ceramic plate of the driver being polarized in alternating longitudinal directions between each adjacent pair of electrode fingers; and the generator being made up of one strip electrode arranged at a position ¼ of the length of the entire piezoelectric ceramic plate from one end surface of the piezoelectric ceramic plate opposite the driver side in the longitudinal direction, the piezoelectric ceramic plate of the generator being polarized in the longitudinal direction between the driver and this strip electrode; and further, the input terminals being connected to the interdigital electrode assembly at the center of the piezoelectric ceramic plate of the driver in the direction of length, and one of the output terminals being connected to one of the ends of the strip electrode and to one of the input terminals and the other output terminal being led out from the other end of the strip electrode.

The above and other objects, features, and advantages of the present invention will become apparent from the following description based on the accompanying drawings which illustrate examples of preferred embodiments of the present invention.

DETAILED DESCRIPTION OF THE PREFERRED EMBODIMENTS

Figure 2A:
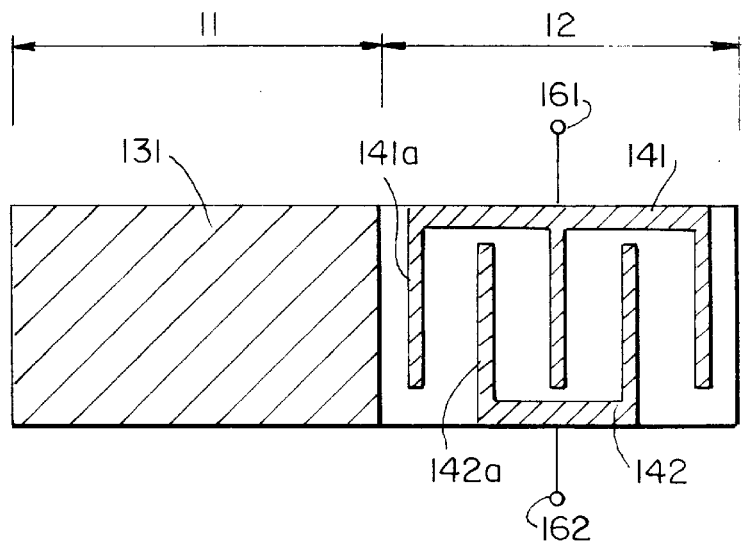
FIG. 2(a) is a plan view showing the construction of a first embodiment of the piezoelectric ceramic transformer according to the present invention.
Figure 2B:
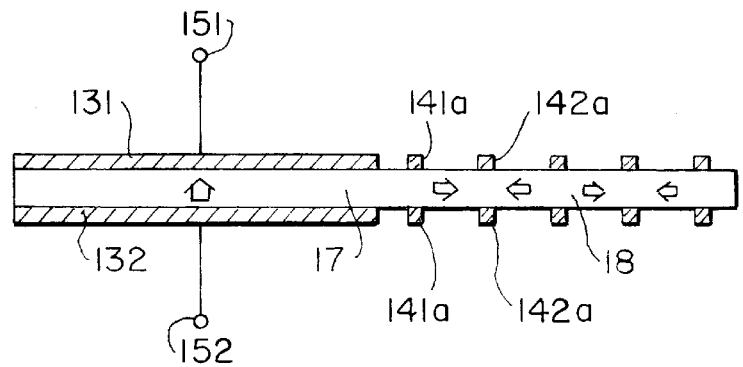
FIG. 2(b) is a sectional view of the same embodiment.

A plan view of the first embodiment of a piezoelectric ceramic transformer according to the present invention is shown in FIG. 2(a) and a sectional view is shown in FIG. 2(b). Driver 11 is made up of piezoelectric ceramic plate 17 polarized in the direction of thickness as shown by the arrow in FIG. 2(b), and one external electrode 131, 132 arranged on each of the upper and lower main surfaces of piezoelectric ceramic plate 17; and external electrical terminals 151, 152 leading away from the central portion in the longitudinal direction of external electrodes 131, 132, respectively. In the generator 12, an assembly of opposing interdigital electrodes 141, 142 are arranged on each of the upper and lower main surfaces of piezoelectric ceramic plate 18. Between interdigital electrode fingers 141a, 142a of interdigital electrodes 141, 142, piezoelectric ceramic plate 18 is polarized in the longitudinal direction in alternately switching polarities as shown by the arrows in the figure; and on both upper and lower main surfaces, external electrical terminals 161, 162 lead from the electrode finger 141a arranged at the central portion of interdigital electrode 141 and from the central portion in the longitudinal direction of interdigital electrode 142, respectively.

Explanation regarding the lead-out location of the external terminals and the driving frequency of the present piezoelectric ceramic transformer will be presented together with that of the second embodiment. Here, the operation of the present embodiment will be explained.

When an alternating voltage of a frequency in the vicinity of the resonance frequency of a longitudinal vibration is applied between external terminals 151–152 of driver 11 of the construction shown in FIG. 2, longitudinal vibration in the longitudinal direction is generated by the piezoelectric transverse effect 31 mode through the electromechanical coupling factor $k_{31}$. This longitudinal vibration is propagated in generator 12, a voltage is generated between interdigital electrodes 141–142 by piezoelectric longitudinal effect 33 mode due to electromechanical coupling factor $k_{33}$, and this voltage is led out from external terminals 161–162. At this time, since the frequency of the applied voltage is equal to the resonance frequency of longitudinal vibration of the piezoelectric ceramic transformer, a rather high output voltage can be obtained. Further, as shown in FIG. 2(b), interdigital electrodes are arranged in matching positions on both the upper and lower main surfaces, but operation is still possible at a slight decrease in generation effect even if the interdigital electrodes are arranged on only one main surface.

Figure 3A:
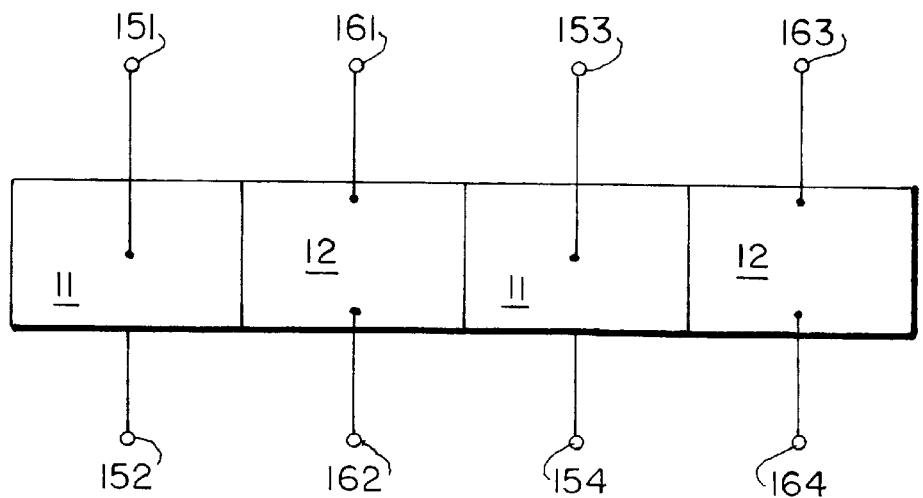
FIG. 3(a) is a connection diagram of the external terminals of the second embodiment of the piezoelectric ceramic transformer according to the present invention.
Figure 3B:
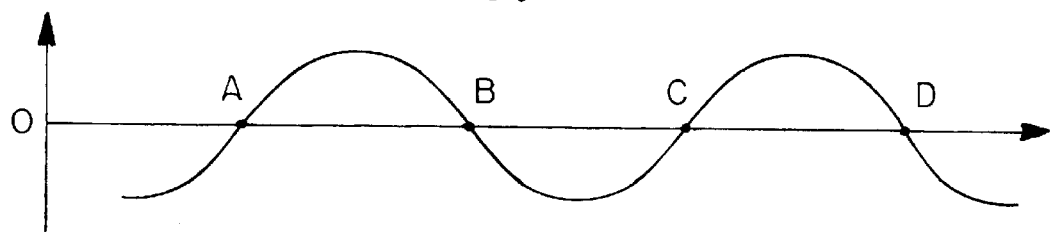
FIG. 3(b) shows the displacement distribution.

A second embodiment of the present invention is shown in FIG. 3. In the present embodiment, two each of the driver 11 and generator 12 described in the first embodiment are formed in a line in an alternating arrangement on the piezoelectric ceramic plate in the direction of length. FIG. 3(a) shows the connection points of the external terminals of this piezoelectric ceramic transformer. FIG. 3(b) shows the displacement distribution of the longitudinal vibration in the longitudinal direction of the (2+2), i.e., fourth order in the longitudinal direction of this piezoelectric ceramic transformer. As is clear from the figure, the lead-out points of external terminals 151, 152, 153, 154, 161, 162, 163, and 164 coincide with vibration nodes A, B, C, and D.

Generally, in longitudinal vibration of pth order, vibration nodes occur at the centers of a number p of divisions into which the length of the piezoelectric ceramic transformer is divided. Accordingly, in a piezoelectric ceramic transformer made up of m drivers and n generators, if driven at the resonance frequency of longitudinal vibration of (m+n)th order in the longitudinal direction, all of the external terminals can be led out from the vibration nodes, thereby achieving excellent vibration characteristics and high reliability. Here, although two drivers and two generators are alternately connected as an example, the present piezoelectric ceramic transformer will operate if there are one or more of each of the driver and generator, and the drivers and generators need not be connected alternately. Moreover, the electrical connections of each of the plurality of drivers and generators may be serial, parallel, or a combination, as long as the connections do not nullify electrical charge.

Figure 4:
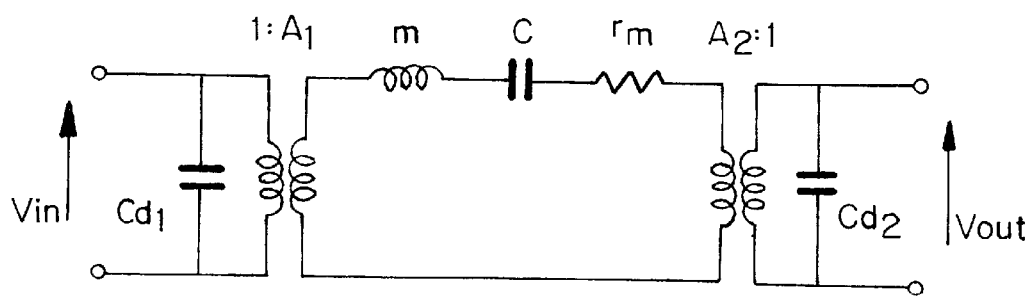
FIG. 4 is a circuit diagram of the lumped constant approximate equivalent circuit of the piezoelectric ceramic transformer according to the present invention

The lumped constant approximate equivalent circuit of the resonant frequency vicinity of the piezoelectric ceramic transformer of the present embodiment, as well as of the first embodiment, is shown in FIG. 4. In FIG. 4, $Cd_1$ and $Cd_2$ are the damped capacities of the input side and output side, respectively; $A_1$ and $A_2$ are the input force factor and output force factor, respectively; and m, c, and $r_m$ are the equivalent mass, equivalent compliance, and equivalent mechanical resistance, respectively, of the concerned longitudinal vibration mode. The input and output force factors A1, A2 of the piezoelectric ceramic transformer of the present invention change with the width and thickness of the transformer, distance between the electrode fingers, and number of the electrode fingers. As is clear from the equivalent circuit of FIG. 4, output voltage $V_{out}$ of the piezoelectric ceramic transformer generally changes according to the resistance of a connected load, and the greater the load resistance value, the greater the value of $V_{out}$. In addition, the energy transmission efficiency depends on the load resistance, and at loads other than a value matching the output impedance of the piezoelectric ceramic transformer, transmission efficiency is not very high. In a piezoelectric ceramic transformer according to the present invention, there is a degree of freedom regarding not only the overall length (the number of drivers and generators), width, and thickness of the transformer, but also the number of electrode fingers or the distance between the electrode fingers, and such a transformer therefore is characterized by a wide range over which the load and the output impedance of the piezoelectric ceramic transformer can be matched.

Figure 1:
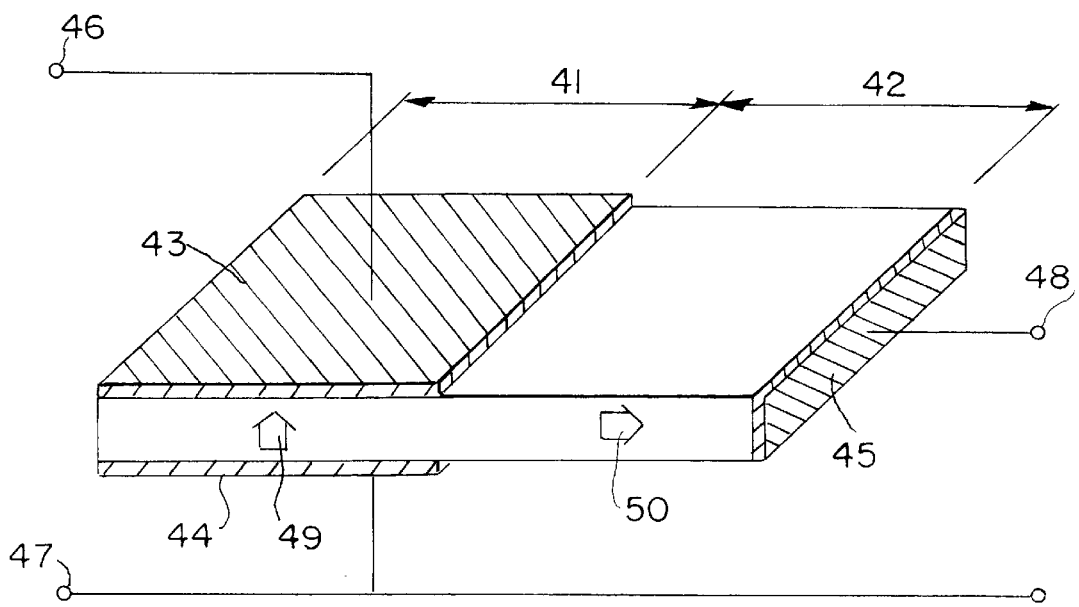
FIG. 1 is a perspective view showing the construction of a Rosen-type piezoelectric transformer of the prior art.

In addition, as is clear from FIG. 2 and FIG. 4, the present piezoelectric ceramic transformer forms a 4-terminal structure in which the external terminals for input and output are electrically insulated, and allow a high degree of freedom of peripheral circuits compared to the 3-terminal Rosen-type piezoelectric transformer shown in FIG. 1.

[Third Embodiment]

Figure 5:
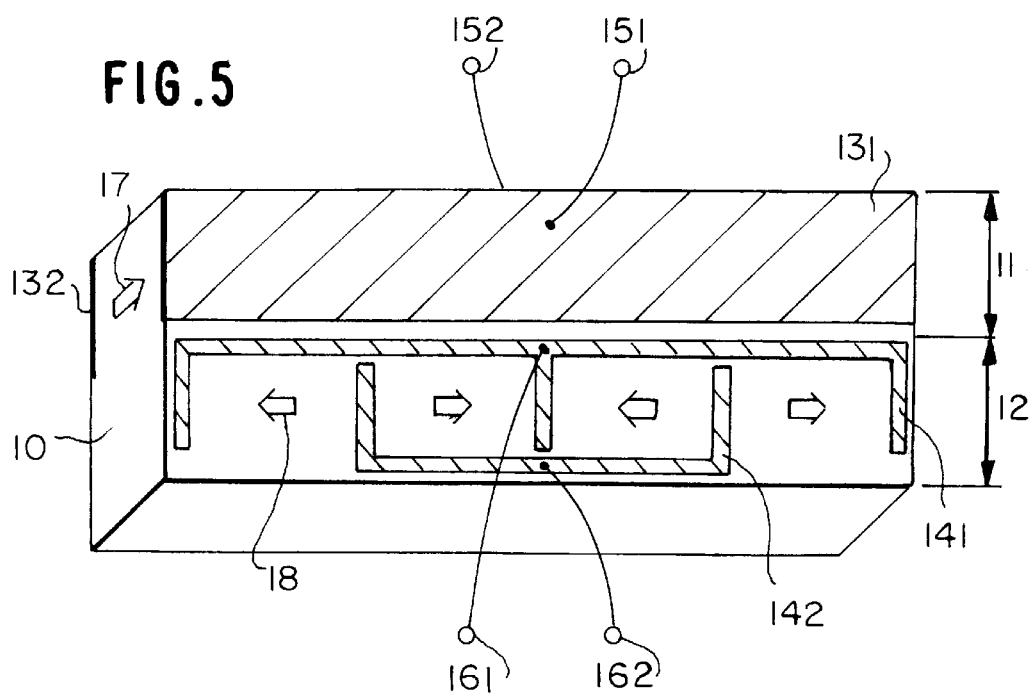
FIG. 5 is a perspective view showing the construction of the third embodiment of the piezoelectric ceramic transformer according to the present invention.

FIG. 5 shows a perspective view of the third embodiment of the piezoelectric ceramic transformer of the present invention. The entire strip-structure piezoelectric ceramic transformer is broadly divided into two parts in the direction of the width: driver 11 and generator 12. As shown by arrow 17 in the figure, driver 11 is constructed with external electrodes 131, 132 arranged on the upper and lower main surfaces of a piezoelectric ceramic 10 polarized in the direction of its thickness, with external electrical terminals 151, 152 leading out from the central portion in the direction of length. Generator 12 is constructed with opposing interdigital electrodes 141 and 142 arranged on one of the main surfaces of piezoelectric ceramic 10 polarized in alternating directions indicated by arrows 18 between the electrode fingers of the interdigital electrodes, with external electrical terminals 161, 162 being led out from the central portions, in the direction of length, of interdigital electrodes 141, 142.

When an alternating voltage is applied between external electrical terminals 151–152 of the driver of the construction shown in FIG. 5, longitudinal vibration is generated in the longitudinal direction of the entire piezoelectric ceramic transformer due to piezoelectric transverse effect 31 mode through electromechanical coupling factor $k_{31}$. Accordingly, in generator 12, a voltage is generated between interdigital electrodes 141–142 due to the piezoelectric longitudinal effect 33 mode through electromechanical coupling factor k33, and the voltage is led out from external electrical terminals 161–162. At this time, if the frequency of the applied voltage is equal to the resonance frequency of longitudinal vibration of the piezoelectric ceramic transformer, a considerably high output voltage can be obtained.

Operation is possible if interdigital electrodes 141, 142 as explained above are arranged on the main surface of only one side, but needless to say, an arrangement having interdigital electrodes in matched positions on both upper and lower main surfaces provides higher generation efficiency.

The lumped constant approximate equivalent circuit in the vicinity of the resonance frequency of this piezoelectric ceramic transformer, as for the first and second embodiments of the piezoelectric transformer, is shown in FIG. 4. Accordingly, the characteristics and advantages of this embodiment are as for the first and second embodiments.

[Fourth Embodiment]

Figure 6:
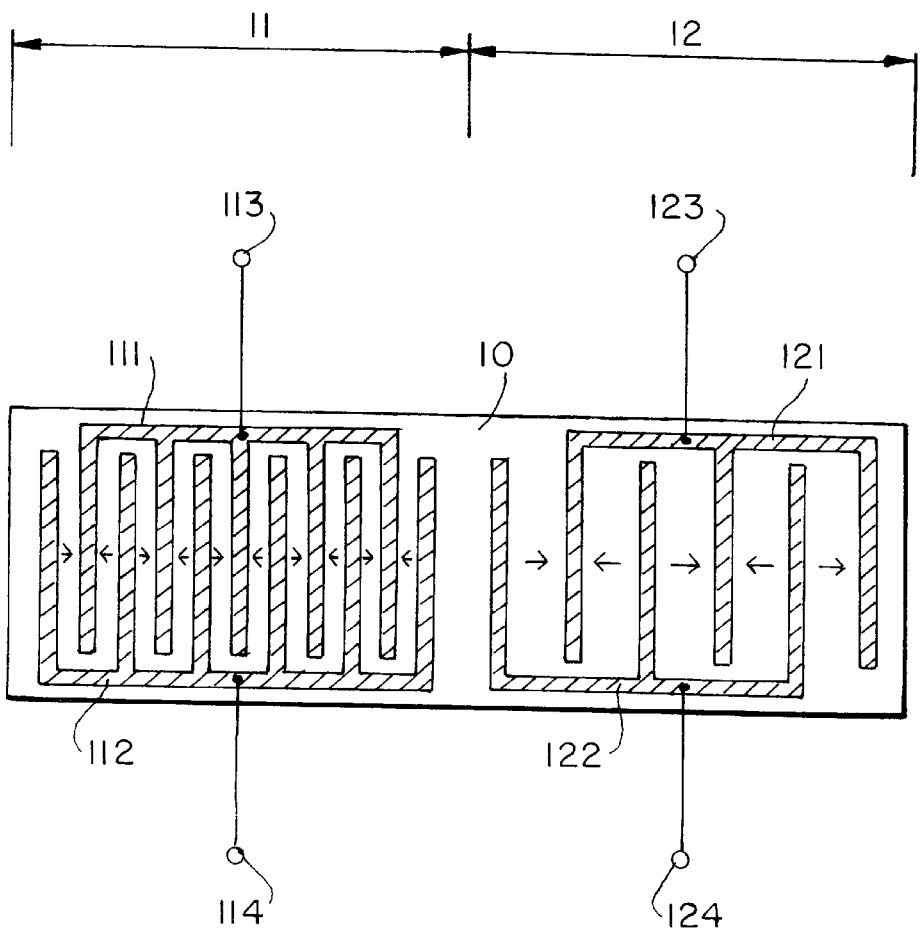
FIG. 6 is a plan view of the fourth embodiment of the piezoelectric ceramic transformer according to the present invention.

The fourth embodiment, a piezoelectric ceramic transformer of rectangular plate structure, is shown in FIG. 6. This piezoelectric ceramic transformer is provided with a rectangular piezoelectric ceramic plate 10, the entire piezoelectric ceramic transformer being divided between driver 11 and generator 12. Driver 11 is arranged with opposing interdigital electrodes 111, 112 arranged on the main surface of driver 11. Each interdigital electrode is constructed of numerous electrode fingers extending along the width of the piezoelectric ceramic transformer and one connecting member electrically linking these electrode fingers. Each electrode finger of one interdigital electrode projects between a pair of electrode fingers of the other interdigital electrode, the electrode fingers opposing each other in the longitudinal direction of the piezoelectric ceramic plate 10. In contrast with a case in which the entire device is uniformly polarized such as a surface-wave device, portions of the plate between opposing electrode fingers are alternately polarized in a longitudinal direction as shown by the arrows in the figure. As for the connecting member, external electrical terminals 113, 114 are led out from the center of the length of driver 11.

Generator 12, as with driver 11, is arranged with opposing interdigital electrodes 121, 122 and is alternately polarized in the longitudinal direction between each pair of electrode fingers as shown by the arrows in the figure. External electrical terminals 123, 124 are led out at the center of the length of generator 12.

Next will be explained the operation of the present embodiment. When an alternating voltage is applied between external electrical terminals 113–114 of driver 11 of the construction shown in FIG. 6, strain in the longitudinal direction is generated between each pair of electrode fingers due to the piezoelectric longitudinal effect 33 mode through electromechanical coupling factor $k_{33}$. At this time, because the direction of polarization and the direction of the applied electric field are both alternating, the portions of the plate between electrode fingers of driver 11 all repeat expansion and contraction at the same phase. As a result, a longitudinal vibration is generated in the longitudinal direction throughout the piezoelectric ceramic transformer. This longitudinal vibration is propagated in generator 12; and in the generator as well, a voltage is generated due to piezoelectric longitudinal effect 33 mode through electromechanical coupling factor $k_{33}$ between each pair of electrode fingers.

At this time, if driven at the same frequency as the resonance frequency of the longitudinal vibration in the longitudinal direction, a high voltage can be obtained in generator 12, and if a second order mode (1-wavelength mode) is employed, vibration nodes will occur at points ¼ of the overall length of the piezoelectric ceramic transformer from both end surfaces. According to the construction of the present invention, extremely high reliability can be achieved because all of the external electrical terminals are led out from these nodes.

Also, it will be easily understood that m drivers 11 and n generators 12 can make a piezoelectric ceramic transformer in the same way as explained in the second embodiment, which is driven at the resonance frequency of longitudinal vibration of (m+n)th order.

As in the piezoelectric transformers of the first to third embodiments, the lumped constant approximate equivalent circuit of the vicinity of the resonance frequency for this piezoelectric ceramic transformer is shown in FIG. 4. Accordingly, the characteristics and advantages of this embodiment are as for the previously described embodiments.

[Fifth Embodiment]

Figure 7:
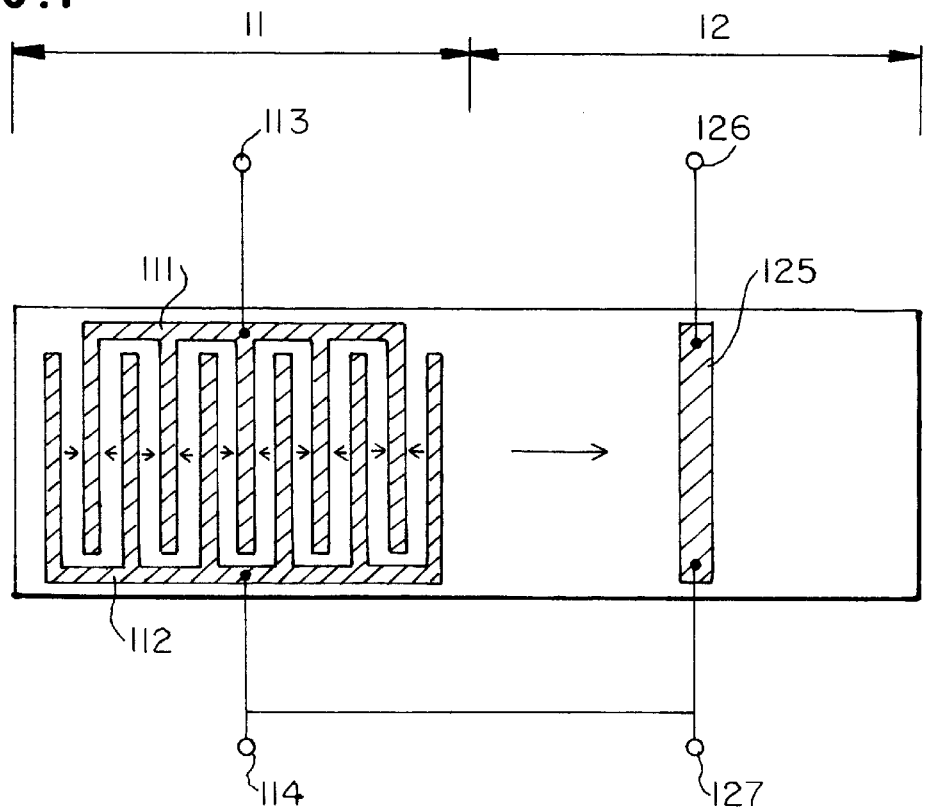
FIG. 7 is a plan view of the fifth embodiment of the piezoelectric ceramic transformer according to the present invention.

The fifth embodiment of the piezoelectric ceramic transformer according to the present invention is shown in FIG. 7. The electrode of driver 11 is the same as for the fourth, but in generator 12, instead of an interdigital electrode, a strip electrode 125, 1 mm wide, is arranged at the center of the output section with one external electrical terminal 126 leading out and the other external electrical terminal 127 connecting to external electrical terminal 114 of driver 11, and in addition, the electrode fingers of driver 11 are 0.3 mm wide. Regarding polarization processing after external terminal connection, voltage is applied to electrodes 111–112 in driver 11, but in generator 12, polarization is between electrode 112 of driver 11 and electrode 125 of generator 12. As a result, only half of the region of generator 12 is activated as a piezoelectric body; however, this arrangement is sufficient for a low-power, three-terminal construction.

Next, an explanation will be given of the manufacturing method of the interdigital electrodes used in each of the above-explained embodiments.

Figure 8:
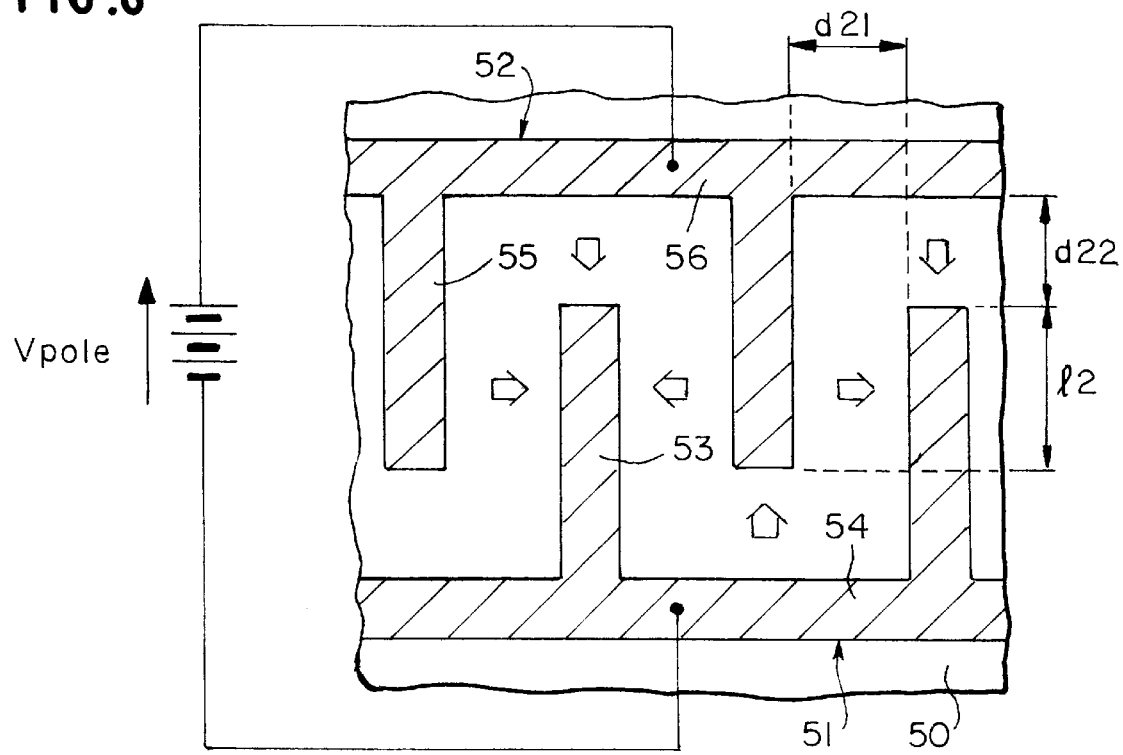
FIG. 8 shows an example of manufacturing method of interdigital electrodes for a piezoelectric ceramic transformer.

As shown in FIG. 8, a case is considered in which opposing interdigital electrodes 51, 52 are formed on the surface of rectangular piezoelectric ceramic 50 which is still inactive after baking. Interdigital electrode 51 is formed from electrode fingers 53 and connecting electrode 56 which links electrode fingers; and interdigital electrode 52 is formed from electrode fingers 55 and connecting electrode 56 which links electrode fingers. These interdigital electrodes may be formed by printing with a conductive paste and baking, by a sputtering method, by a vacuum evaporation method, or by any method that does not chemically or physically damage the piezoelectric ceramic.

After forming an interdigital electrode, a polarization process is carried out to activate the material as a piezoelectric substance (arrows in the figure indicate the direction of polarization). To facilitate polarization at this time, the electrode is placed in a high-temperature state at a level below the Curie point, and an extremely high direct-current voltage $V_{pole}$ is applied between interdigital electrodes 51–52, a field intensity of a level of 3–4 kV/mm being required for a typical PZT ceramic. Because this field intensity approaches the field intensity at which dielectric breakdown occurs between electrodes, the distance between two opposing electrodes must be at least a set amount. In other words, the distance $d_{22}$ between an electrode finger and a connecting electrode must be at least the distance $d_{21}$ between electrode fingers 53–55. As a result, there is the problem that the distance $l_2$ along which electrode fingers 53, 55 oppose each other decreases, thereby decreasing the longitudinal polarized region that can be effectively used as piezoelectric substance. In addition, piezoelectric ceramics when polarized are characterized by expansion in the direction of the electric field and contraction in a direction perpendicular to the electric field compared with the non-polarized state. In a piezoelectric ceramic transformer manufactured according to this method, the region of expansion in the direction of length mixes with the region perpendicular to this of expansion in the direction of width, giving rise to the problem that stress, and consequently a tendency for breakdown, is created in the vicinity of the borders of these regions.

In the present embodiments described above, as shown in FIG. 9, strip-shaped electrodes 11 are arranged on the surface of rectangular piezoelectric ceramic 10 which is inactive after baking. The length of these electrodes is set at a length equal to or greater than the overall width of the interdigital electrode to be formed. Electrically and alternately connected lead lines 12, 13 are led out from the strip electrodes 11 and the polarization voltage $V_{pole}$ is applied (arrows in the figure indicate the direction of polarization). After completion of the polarization process, the lead lines 12, 13 and the strip electrodes 11 are removed.

Figure 9A:
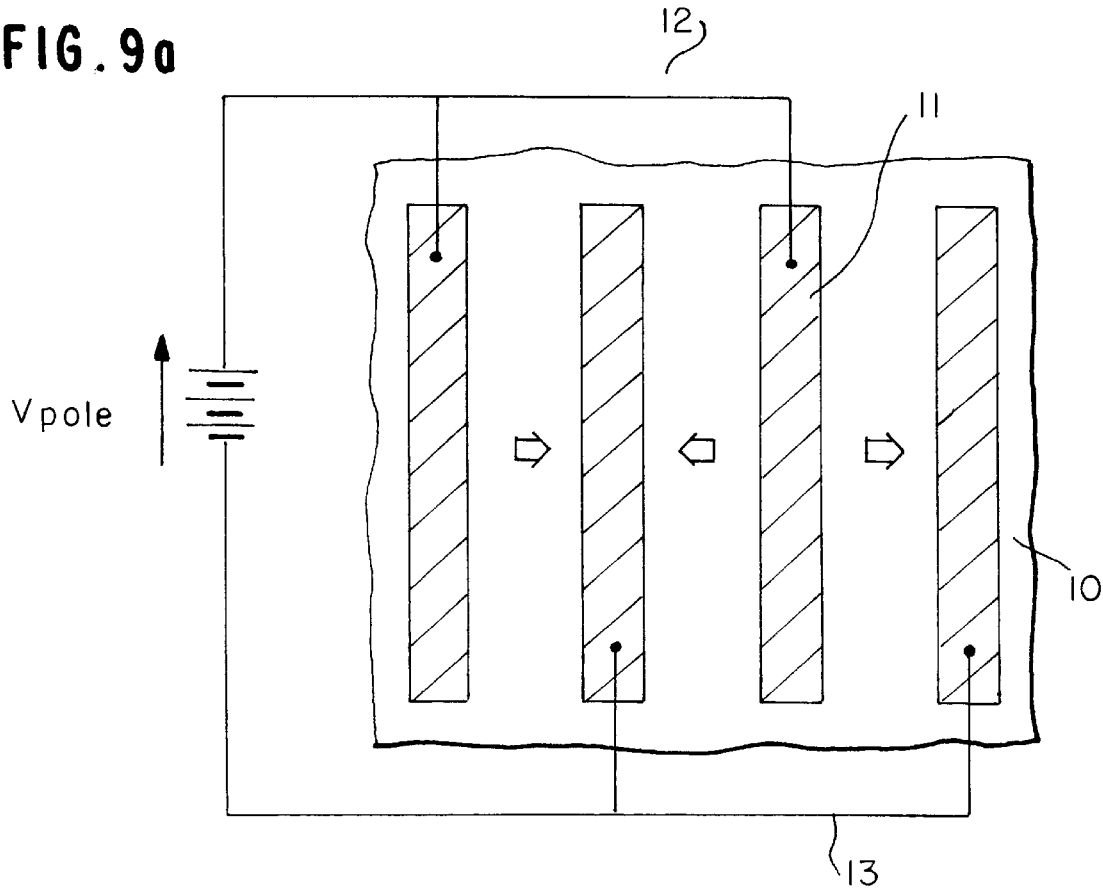
FIG. 9(a) shows the first step of a manufacturing method for interdigital electrodes of each of the embodiments.
Figure 9B:
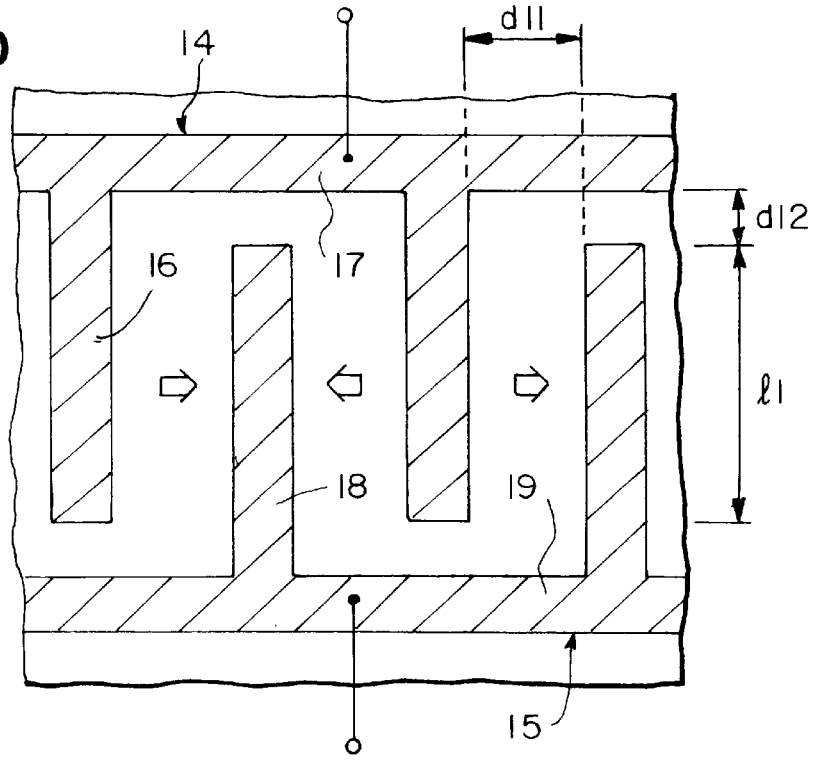
FIG. 9(b) shows the second step of the manufacturing method for interdigital electrodes of each of the embodiments.

Subsequently, as shown in FIG. 9(b), opposing interdigital electrodes 14, 15 are formed at a temperature equal to or less than the Curie point. Interdigital electrode 14 is made up of electrode fingers 16 and connecting electrode 17 which links the electrode fingers; and interdigital electrode 15 is made up of electrode fingers 18 and connecting electrode 19 which links the electrode fingers. At this time, electrode fingers 16, 18 of interdigital electrodes 14, 15 are aligned with the positions of original strip electrodes 11.

When interdigital electrodes 14, 15 are formed by this process, a high voltage for polarization is not applied between the opposing interdigital electrodes, and insulation need only withstand the relatively low voltage used during operation as a piezoelectric ceramic transformer. Consequently, the distance $d_{12}$ between electrode fingers and an opposing connecting electrode may be less than the distance $d_{11}$ between opposing electrode fingers, and to this extent, the distance $l_1$ of opposition between electrode fingers 16, 18 can be made greater, thereby allowing a larger portion of the piezoelectric ceramic to be polarized in the direction of the longitudinal arrows and to function effectively.

Further, as is clear from FIGS. 9(a) and 9(b), because the entire piezoelectric ceramic is polarized in only the longitudinal direction of the piezoelectric ceramic transformer, there are no adjacent regions of differing polarization direction, and the occurrence of mechanical failure can therefore be suppressed.

Next will be explained the manufacturing method of the above-described fourth embodiment shown in FIG. 6 as an example.

A piezoelectric ceramic PZT ($PbZrO_3$-$PbTiO_3$) was used as the piezoelectric ceramic material.

First, a baked piezoelectric ceramic block is cut using a diamond cutter, and a piezoelectric ceramic plate 10 measuring 30 mm long, 8 mm wide, and 1.0 mm thick is prepared by grinding using #3000 SiC grinding powder. Aluminum strip electrodes (not shown in the figure) are formed on the piezoelectric ceramic plate 10 by a vacuum evaporation method using a metal mask. Electrical terminals (not shown) are alternately led out from the strip electrodes using for connection an Ag paste hardened at 150° C.

Next, the driver and generator are both treated by a polarization process in which a voltage of 4 kV/mm is applied in insulating oil at 100° C. After the polarization process, the Ag paste is removed by an organic solvent, and after removing the aluminum electrodes with a KOH etching liquid, interdigital electrodes of Au/Ti composition are formed by a vacuum evaporation method using a metal mask.

In FIG. 6, the interdigital electrodes of driver 11 are indicated as 111 and 112, and the interdigital electrodes of generator 12 are indicated as 121 and 122. To keep the temperature of the piezoelectric ceramic below the Curie point during vacuum evaporation, plate heating is not used, and in addition, external electrical terminals 113, 114, 123, 124 are connected by soldering.

In the above-described manufacturing method, any removable conductive material can be used instead of Al for the strip electrodes, and any method that does not damage the piezoelectric ceramic can be used as the forming method, including a sputtering method, baking method, or plating method. Furthermore, reactive ion etching (RIE) or physical grinding may be used instead of etching liquid. Formation of the interdigital electrodes following polarization may also be carried out by methods other than described above, but formation must occur at a temperature below the Curie point in order that polarization of the piezoelectric ceramic may not be affected.

A maximum output of 1.5 W can be obtained from a piezoelectric ceramic transformer produced in this way, and this represents a large improvement over the maximum output of 1.1 W of the piezoelectric ceramic transformer of the same outside dimensions in which the previously described polarization process is performed after formation of the interdigital electrodes.

In addition, of 100 piezoelectric ceramic transformers manufactured according to this method, not one sample experienced mechanical failure during polarization or during any of the following production processes.

Although certain preferred embodiments of the present invention have been shown and described in detail, it should be understood that various changes and modifications may be made therein without departing from the scope of the appended claims.

What is claimed is:

1. A method for manufacturing a piezoelectric ceramic transformer having an interdigital electrode assembly provided on a surface of the piezoelectric ceramic comprising the steps of:

providing an inactive piezoelectric substrate having its largest dimension in a longitudinal direction;

disposing on a surface of said piezoelectric substrate strips of conductive material, said piezoelectric substrate strips being provided by a coating operation;

energizing said strips with high polarizing voltage so as to polarize said piezoelectric substrate in only the longitudinal direction of said piezoelectric substrate;

removing said strips from said surface; and forming conductive electrodes on said surface of said piezoelectric substrate, said conductive electrodes being aligned with the positions originally occupied by said strips.

2. The method of claim 1, wherein said strips traverse an entire width of said substrate, and wherein the length of said strips is at least equal to the overall width of the interdigital electrodes to be formed.

3. A method for manufacturing a piezoelectric ceramic transformer having an interdigital electrode assembly provided on a surface of a piezoelectric ceramic plate; a first part of the interdigital electrode assembly being made up of a plurality of electrode fingers spaced at intervals and parallel to the direction of width of the piezoelectric ceramic plate and a connecting electrode linking these electrode fingers; said first part and a second part of similar construction to said first part being arranged such that electrode fingers of both said first and second parts alternately project so as to oppose each other across the width of the piezoelectric ceramic plate; comprising the steps of:

provid ing an inactive piezoelectric ceramic substrate having its largest dimension in a longitudinal direction;

disposing on a surface of said piezoelectric substrate strips of conductive material, said piezoelectric substrate strips being formed by a coating operation, each traversing the width of said surface;

energizing said strips with high polarizing voltage so as to polarize said piezoelectric substrate in only the longitudinal direction of said piezoelectric substrate;

removing said strips from said surface;

forming said first part of said interdigital electrode assembly by forming said plurality of electrode fingers on said surface of said piezoelectric substrate on alternating locations previously occupied by respective ones of said strips;

forming said second part of said interdigital electrode assembly by forming a second set of plurality of electrode fingers on said surface of said piezoelectric substrate on remaining alternating locations previously occupied by other ones of said strips; and forming connecting electrodes, each linking said electrode fingers and said second set of plurality of electrode fingers, respectively.

4. The method for manufacturing an interdigital electrode assembly according to claim 3, wherein the distance between said electrode fingers and an opposing connecting electrode is less than the inter distance between opposing electrode fingers.

\* \* \* \* \*